United States Patent
Yan et al.

(10) Patent No.: US 7,618,837 B2
(45) Date of Patent: Nov. 17, 2009

(54) METHOD FOR FABRICATING HIGH ASPECT RATIO MEMS DEVICE WITH INTEGRATED CIRCUIT ON THE SAME SUBSTRATE USING POST-CMOS PROCESS

(75) Inventors: Guizhen Yan, Beijing (CN); Yong Zhu, Beijing (CN); Jie Fan, Beijing (CN); Xuesong Liu, Beijing (CN); Jian Zhou, Beijing (CN); Yangyuan Wang, Beijing (CN)

(73) Assignee: Peking University, Beijing (CN)

( * ) Notice: Subject to any disclaimer, the term of this patent is extended or adjusted under 35 U.S.C. 154(b) by 534 days.

(21) Appl. No.: 11/111,344

(22) Filed: Apr. 22, 2005

(65) Prior Publication Data

US 2005/0287760 A1    Dec. 29, 2005

Related U.S. Application Data

(60) Provisional application No. 60/613,187, filed on Sep. 27, 2004.

(30) Foreign Application Priority Data

Jun. 29, 2004 (CN) .................. 2004 1 0049792

(51) Int. Cl.
*H01L 21/00* (2006.01)

(52) U.S. Cl. .................. 438/51; 438/55; 257/E23.001
(58) Field of Classification Search .............. 438/48–57
See application file for complete search history.

(56) References Cited

U.S. PATENT DOCUMENTS

| 6,121,552 | A | 9/2000 | Brosnihan et al. |
| 6,180,480 | B1 | 1/2001 | Economikos et al. |
| 6,291,875 | B1 | 9/2001 | Clark et al. |
| 6,551,849 | B1 * | 4/2003 | Kenney ..................... 438/34 |
| 6,972,471 | B2 | 12/2005 | Yang et al. |
| 2004/0082140 | A1 | 4/2004 | Yang et al. |
| 2005/0109081 | A1 * | 5/2005 | Zribi et al. ................. 73/31.05 |

FOREIGN PATENT DOCUMENTS

WO    WO-2004/044958    5/2004

* cited by examiner

*Primary Examiner*—Hsien-ming Lee
(74) *Attorney, Agent, or Firm*—Austin Rapp & Hardman

(57) ABSTRACT

The invention discloses a novel flexible, modular fabrication method for integrated high aspect ratio single crystal silicon microstructures designed and manufactured in a post conventional CMOS process (Post-CMOS). The method involves the standard circuits formation, the electrical isolation trenched etching and refilling, backside etching, interconnection formation, and structure releasing. Further, a method of tailoring the trench profile for refill the trench fully without void is also disclosed.

13 Claims, 3 Drawing Sheets

METHOD FOR FABRICATING HIGH ASPECT RATIO MEMS DEVICE WITH INTEGRATED CIRCUIT ON THE SAME SUBSTRATE USING POST-CMOS PROCESS

CROSS-REFERENCE TO RELATED APPLICATION

This application claims the benefit of U.S. Provisional Application No. 60/613,187, filed Sep. 27, 2004.

BACKGROUND OF THE INVENTION

The present invention relates generally to Micro-Electro-Mechanical Systems (MEMS) devices, and more particularly to a method for fabricating high-aspect-ratio device with integrated circuit on the same substrate using post-CMOS microfabrication techniques.

Micro-electro-mechanical systems (MEMS) technology has received increasing attention in recent years. Compared with conventional devices, MEMS devices have advantages in size, weight, cost and power consumption, so they are very attractive for space navigation, military, medicine and automobile application. However, the performance of present MEMS sensors, such as MEMS gyroscopes, especially the accuracy, is not as good as that of conventional sensors.

Recently, a great deal of interests have developed in manufacture processes that allow the monolithic integration of MEMS structures with driving, controlling, and signal processing electronics. This integration promises to improve the microsystem performance of micromechanical devices and potentially lower the cost of device manufacturing and packaging. A modular integration approach is attractive because it allows for separate development of micromechanics and microelectronics technology components. Many processes have been proposed to allow integration MEMS and ICs, such as post-CMOS, pre-CMOS, and hybrid-CMOS processes. In these processes, the post-CMOS process is the more conducive to the use of integrated circuit (IC) foundries for low-cost electronics fabrication. For example, the circuits can be fabricated in any IC foundries using standard cells and their standard IC technology firstly without any MEMS or other process steps. The MEMS could then be fabricated on the IC Wafers.

U.S. Pat. No. 6,121,552 discloses a microfabricated high aspect ratio device, and the formation of the device comprises three steps subsequently: forming an isolation trench, forming circuit region and electrical interconnection, and formation of structure region. Therefore, a pre-CMOS technique is employed in the U.S. Pat. No. 6,121,552.

However, in most cases, the post-CMOS processes are surface micromachining, whose microstructures height is limited to the thickness of the deposited thin film. Moreover, release holes and unwanted curvature of microstructures degrade their application. Furthermore, the post-CMOS necessitates a low thermal budget for the MEMS structure fabrication process, if circuits employing conventional aluminum or copper metal interconnections are used.

A CMOS-MEMS lateral-axis bulk micromachined gyroscope has been reported by Carnegie Mellon University. However, this approach suffers the residual stress and the thermal expansion coefficient in the thin metal/dielectric layers cause curling.

Another problem of prior arts is the formation of void during the refilling of trenches. U.S. Pat. No. 6,291,875 discloses a method for removing the void, in which various condyles are formed and then inserted into the voids. Obviously, this method significantly increases the complexity and cost of forming the device.

Accordingly, there is a need for a method to fabricate high-aspect-ratio silicon MEMS structure with CMOS circuits in same substrate using post-CMOS process, which can increase the accuracy and reliability of MEMS sensors as well as lower the fabricating cost.

SUMMARY OF THE INVENTION

The present invention is designed to solve the problems of the prior arts. It is an object of the invention to provide a method of fabricating high-aspect-ratio silicon MEMS structures with CMOS circuits in same substrate using post-CMOS process, which can increase the accuracy and reliability of MEMS sensors as well as lower the fabricating cost.

In one aspect of the invention, the method comprises the steps of: fabricating circuits on a first region of a substrate using standard CMOS technology; forming electrical isolation trenches in the substrate, backside etching the substrate to expose the bottom of the electrical isolation trenches; forming mechanical structures on a second region of the substrate which is separated from the first region by the electrical isolation trenches; and forming electrical interconnection between mechanical structures and circuits.

The process sequence is shown below in detail:

1) fabricating on-chip circuits on a first region of a substrate using standard CMOS technology (without metallization);

2) fabricating deep electrical isolation trenches in the substrate using silicon deep reactive ion etching (DRIE), refilling electrical isolation dielectric in the electrical isolation trenches, and backside etching the substrate to expose the bottom of the electrical trenches to electrically isolate MEMS structure and CMOS circuits;

3) fabricating electrical interconnection lines to electrically connect MEMS structures and circuits;

4) releasing mechanical structures using DRIE technology.

With the method of the present invention, a high aspect ratio silicon MEMS structure is fabricated with CMOS circuits in same substrate using post-CMOS process, which can increase the accuracy and reliability of MEMS sensors as well as lower the fabricating cost.

In addition, the high aspect ratio isolation trench structure is fabricated using DRIE and dielectric refill technology. The isolation trench realizes the electrical isolation between high-aspect-ratio silicon structures and electric circuits.

According to the method of the present invention, high-aspect-ratio single crystal silicon MEMS structures, which can provide high force, high sensitivity, and good mechanical stability, are obtained.

In addition, the method adopts single crystal material instead of SOI substrate, so the foot effect, which results in the unwanted lateral and reverse directional etching of silicon at the silicon/oxide interface, is avoided.

The detail description of the invention is shown below combined with specific example.

DETAILED DESCRIPTION OF THE INVENTION

Figure 1:
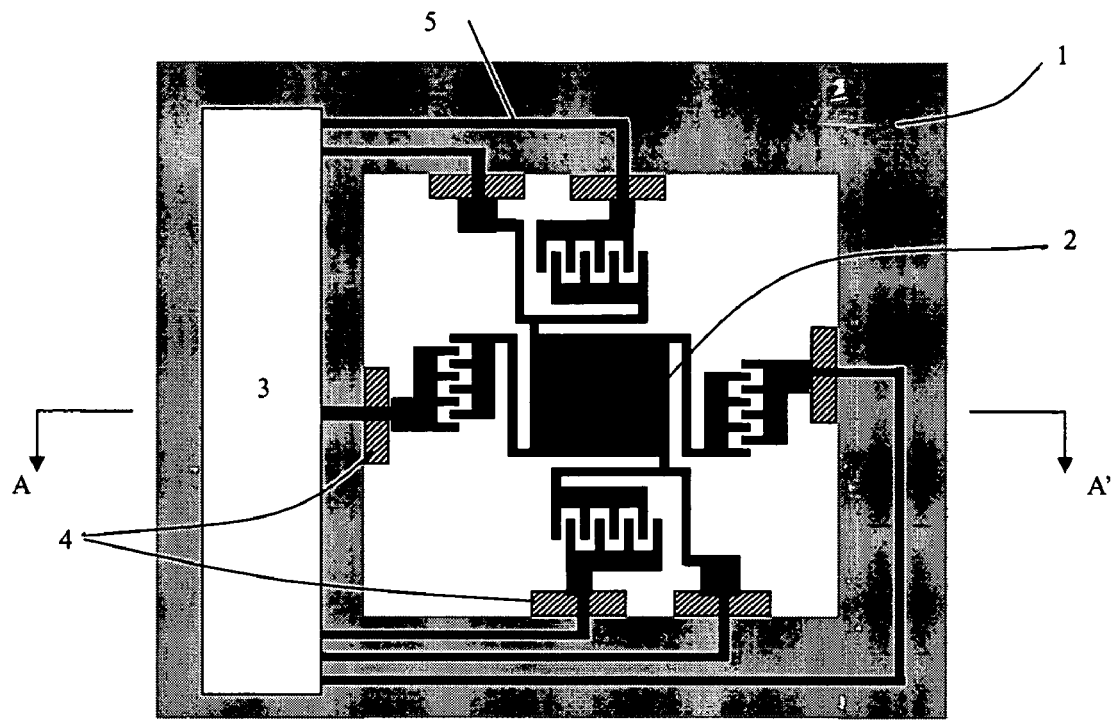
FIG. 1 is a schematic of the integration structure of CMOS and high aspect ratio silicon MEMS using post-CMOS technology.
Figure 2:
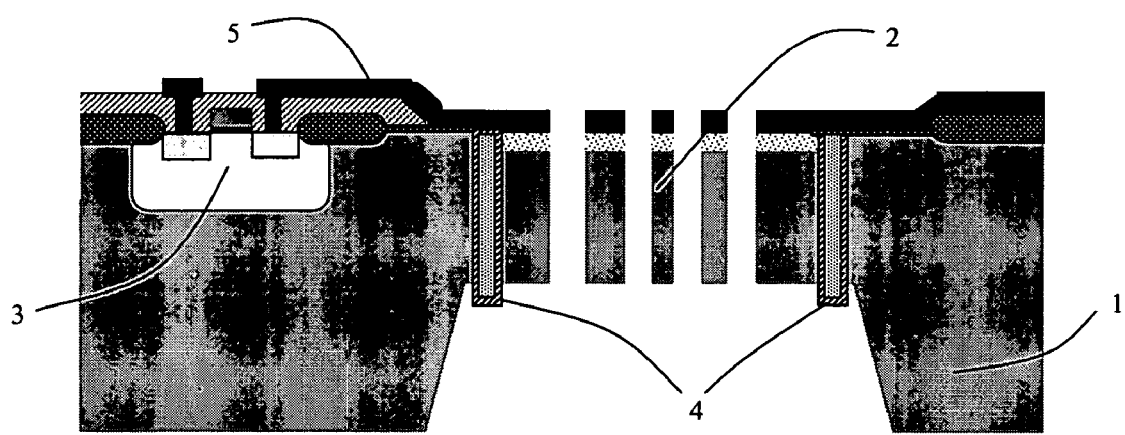
FIG. 2 is a cross-sectional view of FIG. 1 taken from the line A-A' in FIG. 1, in which the cross-sectional view of MEMS structures is schematically insulated.

In order to fully understand the significance of the present invention, the cross-sectional and top schematic of the integration structure of CMOS and high aspect ratio silicon MEMS using post-CMOS technology are shown in FIG. 1 and FIG. 2. Fabrication of devices in accordance with the present invention, as illustrated in FIG. 3, comprises four basic steps of: fabricating on-chip circuits on a first region on a substrate 1 using standard CMOS technology; fabricating deep electrical isolation trenches 4 on the substrate 1; backside etching the substrate 1 to expose the bottom of the trenches 4; and fabricating electrical interconnection lines 5 to connect the circuits 3 and mechanical structures 2, such as MEMS structures, and the releasing the mechanical structures 2.

Referring to FIG. 1 and FIG. 2, the starting material, i.e. substrate 1, may be, in one embodiment, a double-side polished single crystal silicon wafer. The integrated device structure consists mainly of three parts: the mechanical structures 2, the circuits 3, and the electrical isolation trenches 4. The mechanical structures 2 is electrically isolated with the circuits 3 by the isolation trenches 4 to realize the integration. FIG. 2 is a cross-sectional schematic view of FIG. 1 taken from the line A-A'.

FIGS. 3a-3d show the steps for fabricating integrated high-aspect-ratio MEMS device structures using post-CMOS process. As a first step, shown in FIG. 3a, the on-chip circuits 3 are fabricated in the first region of the substrate. The formation of circuits may be accomplished by using any of well-known semiconductor circuit fabrication processes, such as standard CMOS processes.

As the circuits are fabricated on the silicon wafer firstly without any MEMS or other process steps, the circuit formation can be made in any conventional silicon foundries, so the cost of device manufacturing may be greatly lowered.

After formation of circuits 3, the protective layer and oxide layer in the isolation trenches 4 and a second region of mechanical structures 2 are removed to expose the silicon surface.

Figure 3A:
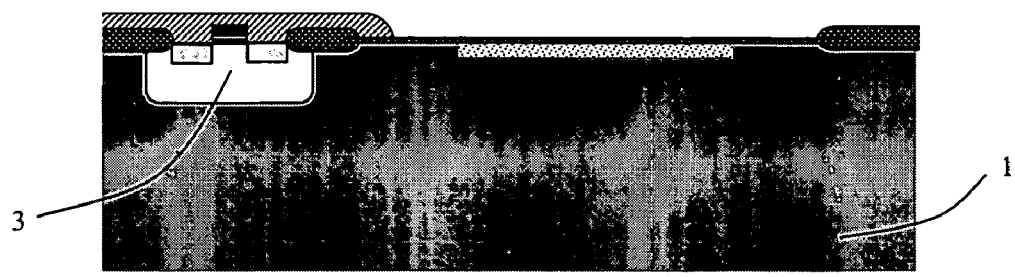
FIG. 3 is a process sequence of the post-CMOS technology.
Figure 3B:
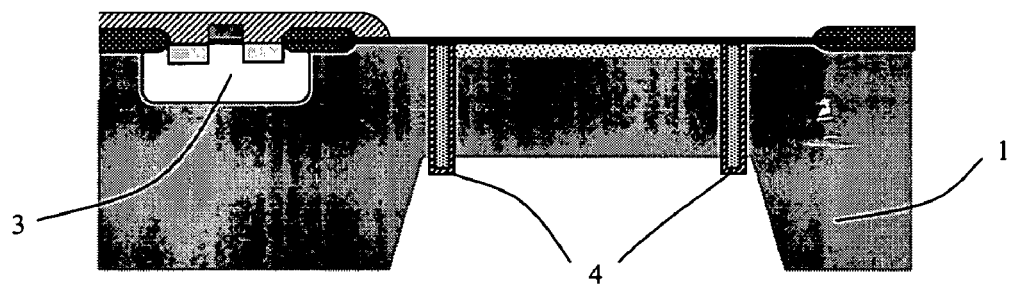
Figure 4:
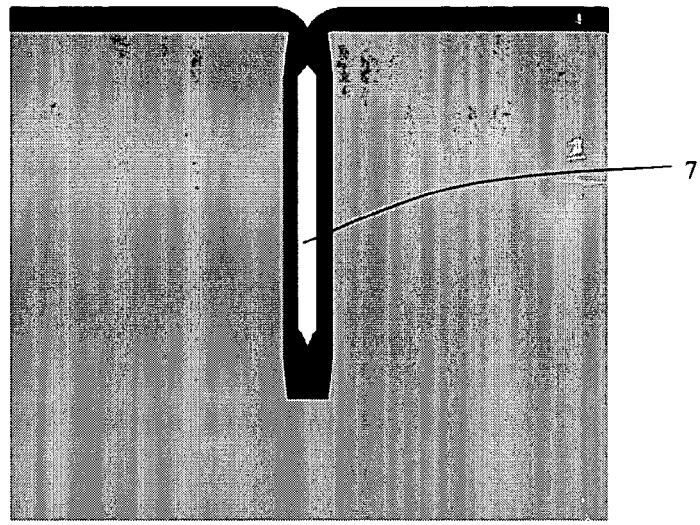
FIG. 4 is a cross-section view showing the refilled trench with void in the prior art.
Figure 5A:
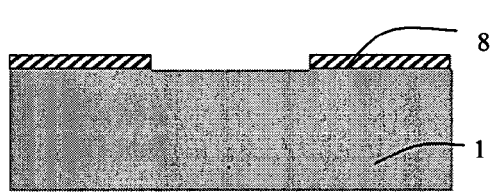
FIG. 5 is a improved fabricate process sequence to widen the trench opening of the invention.
Figure 5B:
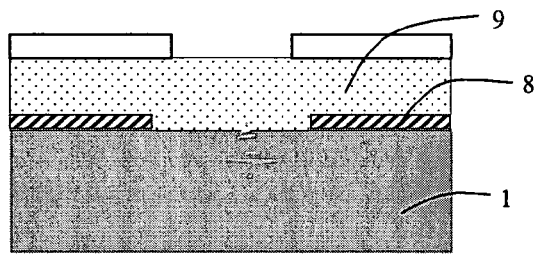

Referring to FIG. 3b, the formation of the isolation trenches 4 follows the formation of the circuit elements 3. The key to implementing the integrated technology is using deep electrical isolation trenches 4 to isolate different mechanical elements from each other and from the circuits while maintaining a mechanical connection. Firstly, deep and high aspect ratio silicon trenches are etched by deep reactive ion etching (DRIE) between the first region of circuits 3 and the second region of mechanical structures 2. However, the conventional methods of filling isolation trenches have significant problems with the mechanical integrity of the fill. As shown in FIG. 4, in the process of prior art refill methods, insulating material accumulates at trench opening and the void 7 is formed in the trench. Void formation is undesirable because voids may significantly reduce the mechanical strength and reliability of the trench. The reason for void is that the trench opening is distinctly narrower than the other part of trench after DRIE, so the insulating material accumulates at trench opening in the coming process, and the void appears in the trench. As the narrowing is happened only in the positions having a depth of 1-3 μm from the opening of trenches, we develop an improved method of removing the 1-3 μm surface silicon layer where the trench opening is narrowing. The improved fabricate process to widen the trench opening is shown in FIG. 5. Different from the prior art, before etching and refilling the trench, an oxide layer 8 is defined with a pattern, whose width is a little larger than the width of the trench (FIG. 5a). Then a polysilicon layer 9 is deposited on the oxide layer by LPCVD and defined with trench pattern (FIG. 5b). The trench pattern is aligned with the pattern on the oxide layer. The polysilicon is selected because the DRIE etching characteristic of polysilicon and the single crystal silicon is almost same. Then the DRIE is adopted to etch the polysilicon and single crystal silicon in turn using the same mask.

Figure 5C:
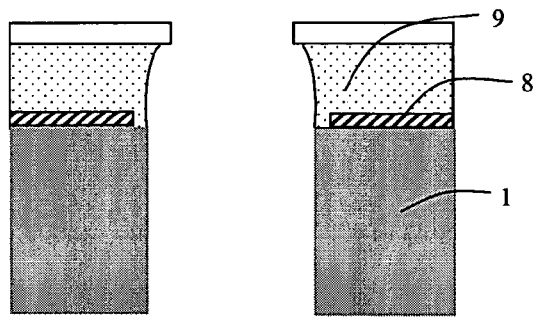
Figure 5D:
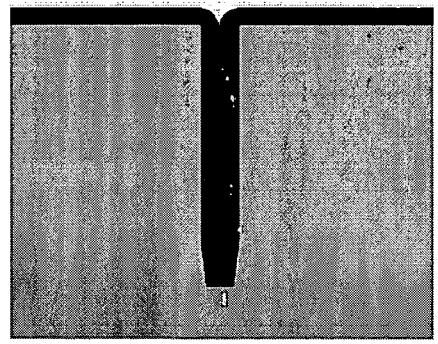

As shown in FIG. 5c, the narrowing only happened in the polysilicon layer and the silicon trench opening under the oxide layer is widened obviously compared to the polysilicon layer opening. Finally, the polysilicon layer and oxide layer are removed. Using these additional processes, the silicon trench can refill very well without void (FIG. 5d).

After silicon trench is etched, the trench is refilled by LPCVD $SiO_2$, polysilicon, LTO, PECVD $SiO_2$ or parylene. Such material may be used as the low temperature electrical isolating dielectric. The thickness of the dielectric depends on the width of silicon trench, ensuring the trench is filled sufficiently.

Referring to FIG. 3b, silicon on the wafer backside is etched to expose the bottom of the isolation trench. After such backside etching, both sides of isolation trench 4 are electrically isolated. The backside silicon can be dry etched by DRIE or wet etched by TMAH or KOH solution. The etching time can be adjusted to ensure trench bottom is exposed fully and obtain desired proof mass thickness.

Figure 3C:
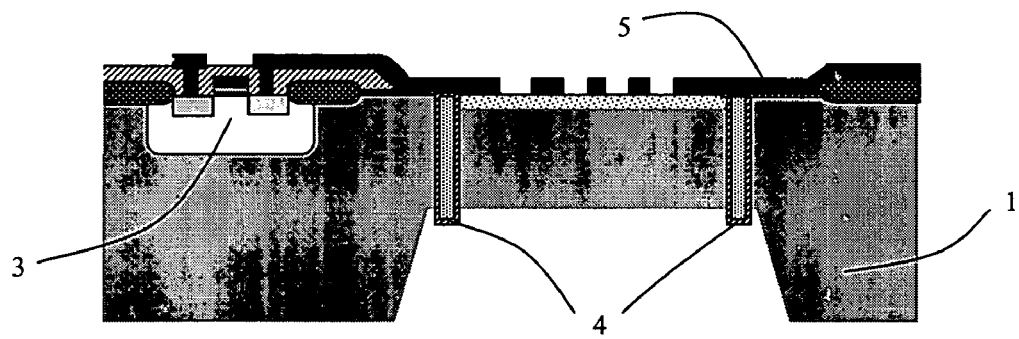
Figure 3D:
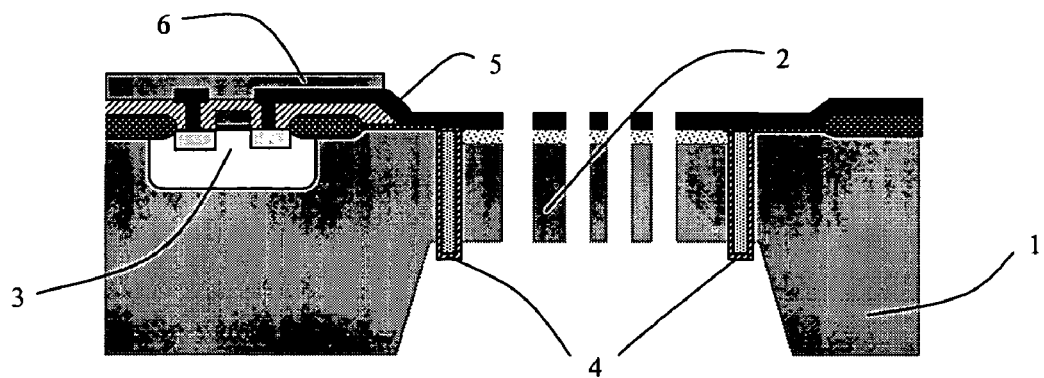

Referring to FIG. 3c, after the contact holes are opened, metal lines are patterned for lead transfers between the first region of circuits region 3 and the second region of structure 2. Meantime, the structure pattern is defined also by this metal layer. Finally, the mechanical structures are released by DRIE using metal mask with photoresist 6 for protecting the circuits (FIG. 3d).

Although the present invention has been described with reference to preferred embodiments, the skilled in the art will recognize that changes may be made in form and detail without departing from the spirit and scope of the invention. Therefore, the scope of the invention is defined by the accompanying claims.

The invention claimed is:

1. A method for fabricating a device with integrated circuit in a same substrate and having mechanical structures using post-CMOS process, the method comprising:
   1) fabricating circuits on a first region of a substrate;
   2) fabricating electrical isolation trenches in the substrate using DRIE, refilling electrical isolation dielectric in the electrical isolation trenches, and backside etching the substrate to expose a bottom of the electrical isolation trenches to electrically isolate the mechanical structures and circuits;
   3) fabricating a metal layer over the substrate;
   4) fabricating an electrical interconnection such that the mechanical structures are electronically isolated from the circuits; and
   5) releasing the mechanical structures using DRIE technology,
   wherein the circuits are fabricated firstly using standard CMOS technology and without a metal connection, and wherein after the fabrication of the electrical isolation trenches, metal is formed as the electrical interconnection and acts as mask of DRIE.

2. The method according to claim 1, wherein the substrate is a double side polished single crystal silicon wafer.

3. The method according to claim 1, wherein the electrical interconnection is disposed over the electrical isolation trenches to connect the circuits and the mechanical structures.

4. The method according to claim 1, wherein the electrical isolation trenches are between a first region of the circuits and a second region of the mechanical structures.

5. The method according to claim 1, wherein the thickness of the mechanical structures is varied depending on applications, and thickness of the electrical isolation trenches is changed accordingly, confirming that the electrical isolation trenches are thicker than the mechanical structures.

6. The method according to claim 1, further comprising depositing a passivation layer to protect the circuits after the formation of the circuits.

7. The method according to claim 1, further comprising forming a photoresist on the circuits as a protection layer to protect the circuits during DRIE.

8. A method of claim 1, further comprising filling the electrical isolation trenches, wherein the filling is performed by:
- forming an oxide layer on a single crystal silicon with a pattern, a width of the pattern being larger than that of the electrical isolation trenches;
- depositing a polysilicon layer on the oxide layer by a deposition process to define a trench pattern;
- etching the polysilicon layer and single crystal silicon in turn using a same mask by DRIE; and
- removing the polysilicon layer and oxide layer by DRIE and BOE solution respectively after the mask is removed.

9. The method according to claim 8, wherein the trench pattern is aligned with the pattern on the oxide layer.

10. A method for electrically isolating structures from each other and from circuits on a wafer, the method comprising:
1) fabricating silicon trenches by DRIE technology between a first region of the circuits and a second region of the electrically isolating structures;
2) depositing a layer of insulating material to refill the silicon trenches, wherein the insulating material includes an electrical isolating dielectric;
3) etching the wafer from backside to expose a bottom of the silicon trenches;
wherein the method further comprises filling the silicon trenches, wherein the filling is performed by:
forming an oxide layer on a single crystal silicon with a pattern, a width of the pattern being larger than that of the silicon trenches;
depositing a polysilicon layer on the oxide layer by a deposition process to define a trench pattern;
etching the polysilicon layer and the single crystal silicon in turn using a same mask by DRIE; and
removing the polysilicon layer and the oxide layer by DRIE and BOE solution respectively after the mask is removed.

11. The method according to claim 10, wherein the electrical isolating dielectric comprises at least one of LPCVD $SiO_2$, LTO, PECVD $SiO_2$ and parylene.

12. The method according to claim 10, wherein the backside of the substrate is dry etched by DRIE or wet etched by TMAH or KOH solution.

13. The method according to claim 10, wherein the trench pattern is aligned with the pattern on the oxide layer.

* * * * *